United States Patent [19]

Bruhn

[11] Patent Number: 4,877,174
[45] Date of Patent: Oct. 31, 1989

[54] TAB DEVICE EXCISE AND LEAD FORM APPARATUS

[75] Inventor: Peter H. Bruhn, Georgetown, Tex.

[73] Assignee: International Business Machines Corporation, Armonk, N.Y.

[21] Appl. No.: 289,996

[22] Filed: Dec. 21, 1988

[51] Int. Cl.$^4$ ............................................. H01L 21/98
[52] U.S. Cl. ...................... 228/5.1; 228/6.2; 228/13; 228/15.1; 228/10; 29/835
[58] Field of Search ................. 228/5.1, 6.2, 13, 15.1, 228/44.7, 10, 170, 180.2; 29/835

[56] References Cited

U.S. PATENT DOCUMENTS

| | | | |
|---|---|---|---|
| 3,488,672 | 1/1970 | Martyn | 29/835 |
| 3,887,783 | 6/1975 | Comette | 228/170 |
| 4,071,180 | 1/1978 | Dupuis | 228/6.2 |
| 4,166,562 | 9/1979 | Keizer et al. | 228/15.1 |
| 4,399,610 | 8/1983 | Moyer | 228/180.2 |
| 4,411,149 | 10/1983 | Delorme | 228/15.1 |

Primary Examiner—Richard K. Seidel
Assistant Examiner—Samuel M. Heinrich
Attorney, Agent, or Firm—Andrea P. Bryant

[57] ABSTRACT

Apparatus is described for excising and forming tape mounted electronic devices in an automated fashion so that as the tape bearing the components is fed past a punch and die set, each frame bearing an electronic component is precisely aligned and the electronic component has its leads simultaneously excised from the tape and formed in a predetermined configuration, in a self aligning zero clearance punch and die set, the device so excised being then transferred to a presentation area for pickup for subsequent assembly operations.

10 Claims, 5 Drawing Sheets

TAB DEVICE EXCISE AND LEAD FORM APPARATUS

DESCRIPTION

1. Field of the Invention

The present invention relates generally to packaging technology for surface mountable components on printed circuit boards. More specifically, it relates to apparatus for simultaneously excising a leaded TAB component from a tape bearing a plurality of such components and forming component leads in preparation for subsequent assembly process operations.

2. Description of the Prior Art

U.S. Pat. No. 3,887,783 teaches devices for welding of integrated circuit wafers previously mounted on a carrier film having metalizations thereon. The device comprises a plate and die on which each chip is successively adjusted and a bonding head shaped to engage in said die for cutting the leads of each adjusted chip and carrying the cutout chip to the substrate on which it is to be attached. The principle differences between the prior art is represented by the '783 patent and the present invention relate to the simultaneity of the excise and lead forming step of the present invention and the manner of aligning the frame of the carrier film prior to the simultaneous excise and lead forming operation.

U.S. Pat. No. 4,166,562 teaches means for excising TAB device and means for forming the leads thereof. The means for excising and forming are positioned in opposed cooperating relation to each other. In this reference a tape bearing a TAB device is cleaned before the device is excised and subsequently has it leads formed by a forming tool reciprocally mounted with respect to a punch and die. The principal differences between the teaching of this reference and the instant invention relate to punch and die structure and the sequential nature of the referenced device operation.

When the number of leads is increased they become even more delicate and require even more careful handling to avoid damage thereto. Great care must be taken, too, to assure alignment is correct at each step in handling since such lightweight articles are easily moved.

A high degree of precision is needed in any apparatus for handling such articles. However, conventional precision punch presses are much to heavy for use with TAB devices. In particular, conventional techniques for providing zero clearance between a punch and die involve high precision to maintain desired alignment machinery for this task. It is desirable to be able to blank TAB devices from a tape bearing a plurality of such devices at regularly spaced intervals with great precision, burr free with minimized opportunity for damage to or distortion of the leads. It is also desirable to be able to transfer excised and formed parts to a location where it can be picked up for assembly to a carrier.

Typically, the flexible tape bearing the components is about 0.002 inch in thickness and the leads are made in a layer of copper thereon about 0.0014 inch thick. Clearance needed to blank copper is 7% of stock thickness or less than 0.0001 inch. Typical planar frame dimensions range from 35 mm×35 mm for square lead frames to 35 mm×48 mm for rectangular lead frames. Thus high precision and great delicacy are required to handle the excise, form and transfer steps.

SUMMARY OF THE INVENTION

The present invention presents an improvement over prior art apparatus by providing apparatus for simultaneously excising and forming to a high level of precision leaded TAB components using a self aligning, zero clearance punch and die.

A tape bearing a plurality of such devices is automatically, in a measured manner, fed from a reel through a station comprising a pneumatically operated press and a punch and die assembly in which the excise and form operation takes place. Means is provided for conveying a component so excised and formed to a presentation stage from which it may be picked up for final assembly or other operations.

A sensor is provided at the punch and die interface for indicating the presence of a component on the tape. A frame of tape with a component is grossly aligned at the excise and form station by nesting in the die.

The die set is closed. Final, fine alignment then takes place using pins adapted to cooperate with alignment holes provided at each frame of the tape. These upwardly loaded pilot pins are driven down where they remain until the die set is opened. A vacuum maintains the excised and formed component on the punch face during transport to the presentation stage.

The apparatus includes a slide on which the punch holder is mounted. The slide moves to position the punch holder bearing the excised and formed component relative to a presentation stage. The punch holder is lowered onto the presentation stage which is provided with an alignment mechanism similar to that used with the die. A vacuum pull down is provided at the stage so that when the vacuum on the punch face is removed, the excised and formed component adheres in precise alignment to the presentation stage where its presence is detected by another sensor. The slide returns to its original position and the tape is fed in a step by step manner to position the next frame having a component at the excise and form station.

Zero clearance between the punch and die is enabled by the structural features of the punch blades of the present invention. In a preferred embodiment to be described below, four such blades are provided to excise and form leads burr free. Leads are formed so that the chip is suspended beneath the TAB device when attached to a printed circuit board to thereby facilitate subsequent cleaning steps.

The particular advantages of the present invention proceed from the structure and cooperation of the punch and die used for excising and forming. The punch and die are self aligning because the four blades carried in the punch holder are spring biased such that the cutting edge of a given punch blade does not initially coincide with the cutting edge of the die. The punch blades are configured to include a projection, called a heel, which acts as a cam for guiding the punch blades into perfect alignment with the die cutting edges.

The die is provided with pressure pads disposed to oppose the force of each punch blade so that after excision of the leads they are held in position for forming by the continuing downward movement of the punch blades which motion brings the forming edge of each punch blade into cooperating relation with the die form block.

Dimensions of the various elements of the punch and die apparatus are a function of the dimensions of the leaded components mounted on the flexible tape. Thus, the present apparatus is adapted to receive interchangeable punch and die sets to accommodate a variety of TAB devices.

BRIEF DESCRIPTION OF THE DRAWINGS

The above noted and other aspects and advantages of the present invention will be described in connection with the various figures of the drawing in which the same reference numerals denote the same elements throughout and wherein.

DESCRIPTION OF THE PREFERRED EMBODIMENT

Figure 1:
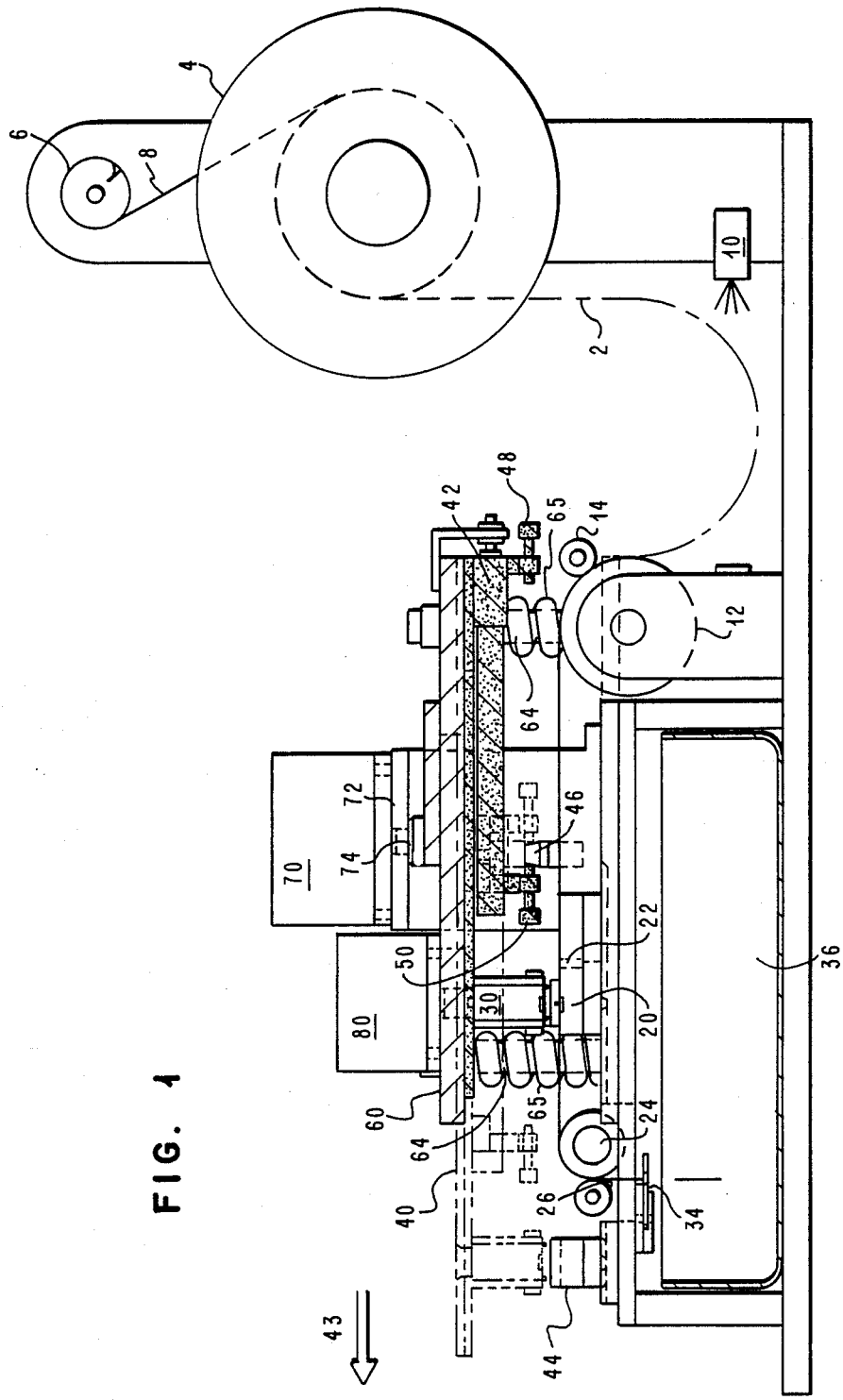
FIG. 1 is a side view of apparatus including the present invention.

Refer now to FIG. 1 which is a side view of apparatus for automatically feeding TAB devices mounted on a reel of tape of such devices into a pneumatically operated press for excising and forming individual device leads and moving the excised and formed device to a presentation stage located in an area from which other apparatus can remove it for subsequent assembly operations.

In FIG. 1, tape 2 bearing a plurality of leaded electronics components, is wound on a reel 4. The tape 2 is unwound by the action of takeup spool 6 winding of tape separator layer 8 therearound. Takeup spool 6 is driven by a motor (not shown) under the influence of the amount of slack in tape 2 detected by sensor 10. Tape 2 is fed between idler roller 12 and adjustable tension roller 14 over die 20 and its associated component presence sensor 22 to a sprocket roller 24. Roller 26 cooperates with sprocket roller 24 which driven in a step by step manner by a bidirectional stepper motor, not shown, to pull tape 2 through die 20 to properly position a frame bearing a leaded component beneath punch holder 30.

Tape cutter 34 is provided for shredding tape 2 from which components have been excised and guiding the shredded tape carrier into the scrap bin 36.

Punch holder 30 is fixedly mounted to slide 40 which pneumatic cylinder 42 moves in the direction of arrow 43 to place punch holder 30 over presentation stage 44. A positive stop 46 is provided for cooperating with adjustable stop 48 in limiting the movement of slide 40 in the direction of arrow 43. Similarly, adjustable stop 50 cooperates with positive stop 46 when slide 40 is moved in the direction opposite that of arrow 43.

Vacuum means is provided on the punch for a purpose as will be explained below.

The apparatus shown in FIG. 1 includes top plate 60 for punch holder 30 and die 20. Top plate 60 is maintained in alignment with the frame on which die 20 is located by four guide pins 64, of which two are shown. Four die springs 65, one around each guide pin 64, hold top plate 60 in a normally open position.

Pneumatic cylinder 70 is provided for lowering punch holder 30 to the face of die 20. Cylinder 70 is mounted on a structure 72 which bridges the die set such that when cylinder 70 is actuated it exerts downward force on top plate 60 to cause punch 30 to bottom on die 20. Removable spacer 74 is provided between cylinder 70 and top plate 60. Removing spacer 74 facilitates installation of other punch and die sets by providing additional clearance.

A second pneumatic cylinder 80 is provided for moving the punch blades, not shown in this view, into and out of their active positions.

Figure 2:
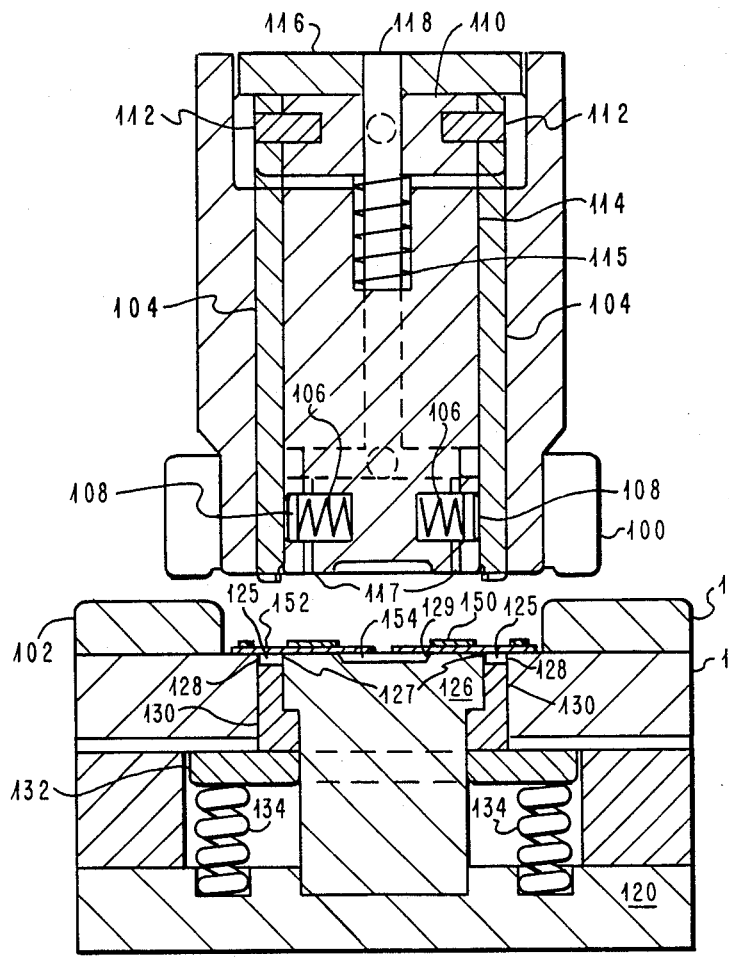
FIG. 2 is a cross-sectional view of the punch and die before simultaneously excising and forming leads.

Refer now to FIG. 2, which shows an enlarged, detailed cross-section of punch holder 30 and die 20. Punch holder 30 includes a pair of guiderails 100 for nestingly engaging a pair of orthogonally oriented guiderails 102 located on die 20. There are four punch blades in punch holder 30. Two punch blades 104 can be seen in FIG. 2. Each punch blade 104 is biased by a spring 106 outwardly from the center of punch holder 30. A button 108 is provided on the face of each spring 106 for presenting a smooth surface when its associated punch blade 104 moves downwardly.

Punch blades 104 are connected to actuator block 110 by means of dowel pins 112. A pressure pad 114 is provided as part of the punch assembly for holding tape 2, FIG. 1, firmly on die 20 while the excise and form operation occurs, as will be understood as this description progresses. Spring 115 is provided in punch holder 30 for holding punch blades 104 in their retracted position and spring loading pressure pad 114 away from actuator block 110 when pad 114 contacts a frame of tape 2 during the excise and form operation.

Actuator block 110 is attached to back up plate 116 which transmits force from air cylinder 80 to punch blades 104. Holes 117 and 118 are interconnected and disposed within punch holder 30 so that vacuum may be drawn therethrough.

Die 20 includes die holder 120, which forms a base for the die assembly. Die 20 includes die block 124, die opening 125 and forming block 126. Forming block 126 includes forming edges 127, and cutting edges 128 are provided on die block 124. A recess 129 is provided in forming block 126 for accommodating the electronic component portion of the TAB part to be excised and formed.

Pressure pads 130 are disposed beneath die openings 125 and adapted to cooperate with punch blades 104. Pressure pads 130 are supported by backup plate 132, which is upwardly biased by springs 134, seated in die holder 120.

Also shown in FIG. 2, resting on the face of die 20 and form block 126 is one frame of tape 2 (FIG. 1). As will be described again in connection with FIG. 8, tape 2 is a multilayer composite. There is a layer of flexible film 150 over which is disposed a layer of conductive metal, such as copper, from which leads 152 have been formed and connected to an electronic device, chip 154.

As noted earlier, the dimensions of any given punch and die set are chosen to conform to the dimensions of a given chip type and lead frame on tape 2. Thus, chip 154 is shown in a correspondingly configured space (recess 129) in die 20.

Figure 3:
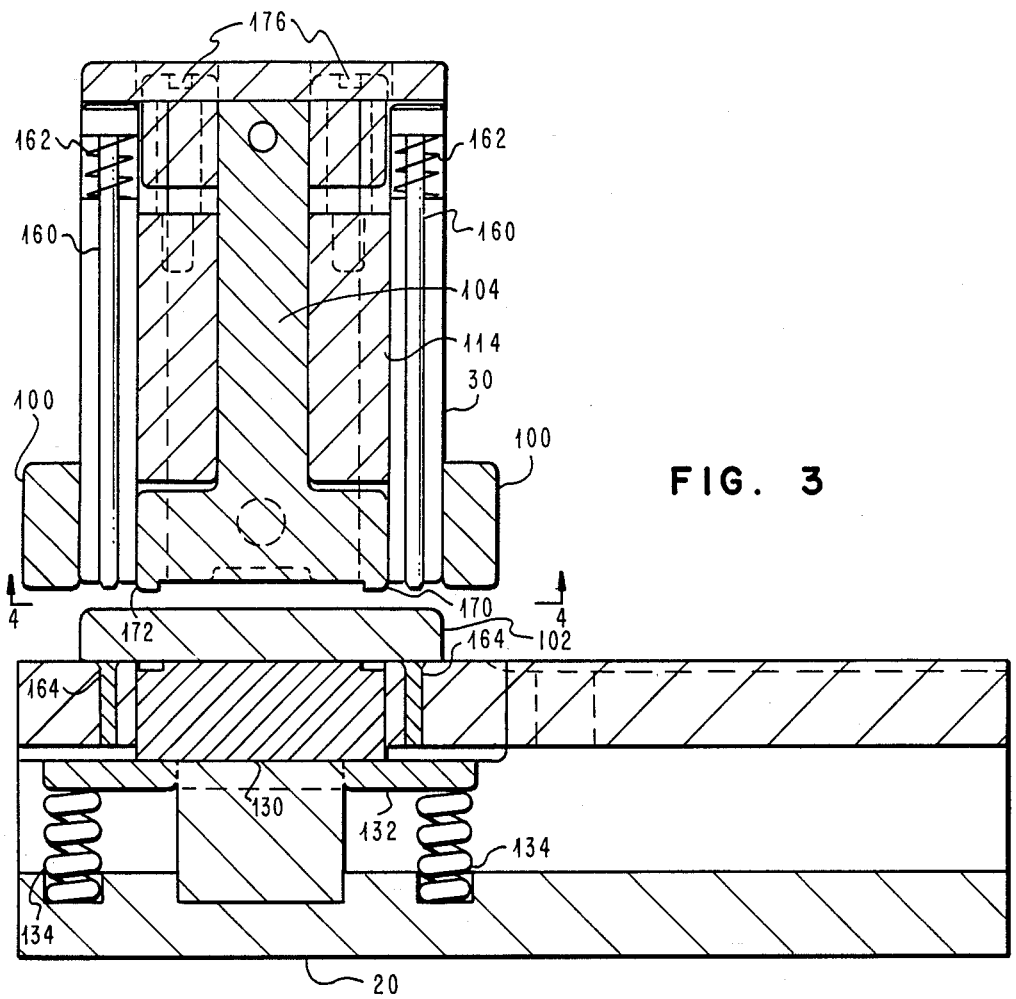
FIG. 3 is another view of punch and die taken along the arrows 3—3 in FIG. 2.

Refer now to FIG. 3. Two of four pilot pins 160 in punch holder 30 are shown. Pilot pins 160 are provided for aligning a frame of tape 2 in the punch and die assembly after gross alignment is achieved through the nesting of punch guiderails 100 with die guiderails 102, which alignment takes place when punch holder 30 is lowered as cylinder 70, FIG. 1, is activated. The action of air cylinder 80 overcomes the upward bias of springs 162 and lowers pilot pins 160 into cooperatively located alignment holes 164 in die 20 whereby a given frame of tape 2 undergoes fine alignment in the die.

Each punch blade 104 includes a pair of heels 170 and 172 for providing an additional alignment function which will become more clear in connection with the description of FIGS. 7A-7G.

Four shoulder screws 176 are provided to hold pressure pad 114 in spaced apart relation to actuator block 110. Spring 115 maintains a predetermined height relationship between punch blades 104 and punch holder pressure pad 114 when punch holder 30 is withdrawn from die 20.

Figure 4:
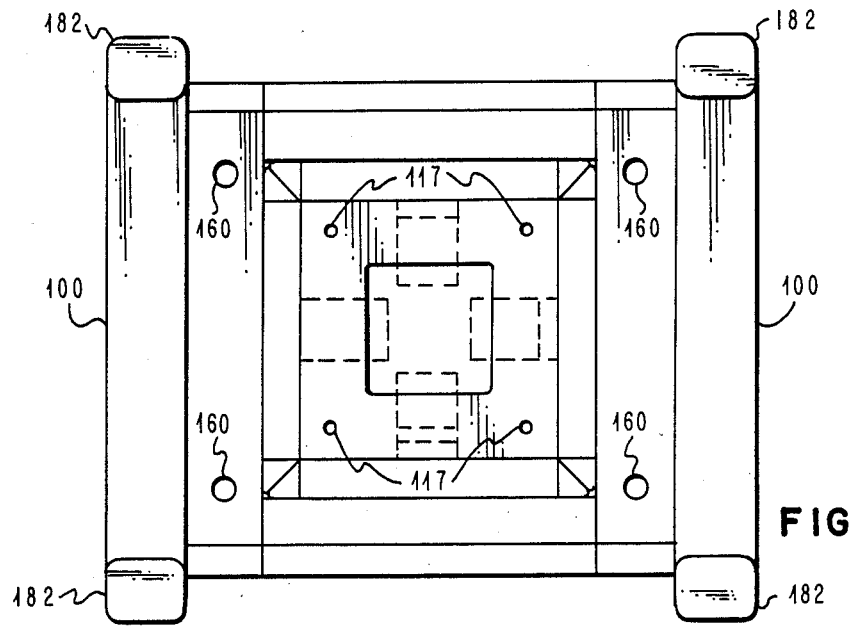
FIG. 4 is plan view of the bottom of punch holder 30 taken along the arrows 4—4 in FIG. 3.

FIG. 4 is a view of punch holder 30 taken in the direction of arrows 4 through FIG. 3. Also visible in this view are openings to holes 117 through which vacuum is drawn to maintain an excised component (154, FIG. 2) in contact with the face of pressure pad 114 in punch holder 30 during transport to pick up stage 44. Pads 182 on punch guiderails 100 are provided for preventing clamping of tape 2 (FIG. 1) to the die 20 by punch holder 30. Pads 182 maintain clearance so that pilot pins 160 may assure final alignment.

Figure 5:
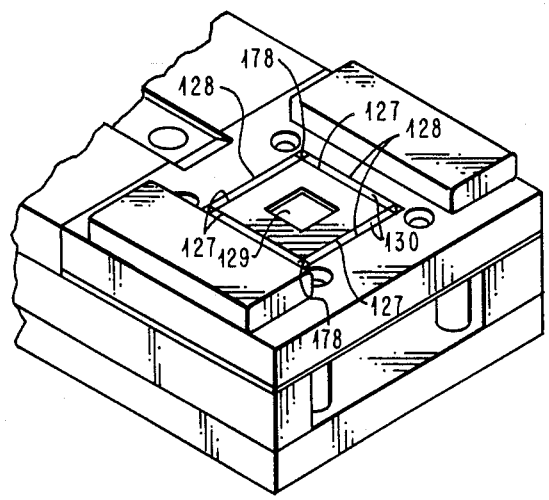
FIG. 5 is a perspective view of die 20.

FIG. 5 is a perspective view of die 20 enabling better appreciation of the die surface openings into which punch blades 104 descend while excising and forming copper leads 152 (FIG. 2). All die openings are configured to conform precisely to the outline of a TAB part. Recess 129 is provided in forming block 126 for accepting component 154 during the excise and form operation. The cutting edges 128 of die 20 cooperate with the cutting edges 190 (FIG. 6) of punch blades 104 to excise leads 152 (FIG. 2) while simultaneously forming edges 127 of form block 126 cooperate with the forming edges 196 of punch blades 104 (FIG. 9) to form leads 152. The upper surfaces of die pressure pads 130 are visible in die opening 125. Corners 178 of die opening 125 are configured to receive punch blade heels 170 and 172.

Figure 6:
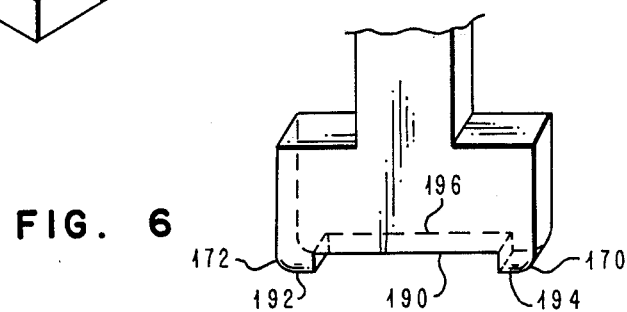
FIG. 6 is a detailed view of any of punch blades 104.

FIG. 6 is a schematic view of a punch blade 104, showing heels 170 and 172, flat bottom surfaces 192 and 194 of heels 170 and 172, respectively, cutting edge 190 and forming edge 196.

The camming action of the radius portion of heels 170 and 172 of each punch blade 104 in cooperation with die opening corners 178 will be better understood in connection with the description of FIG. 7.

Zero clearance alignment is obtainable between a punch and die apparatus of the present invention as a result of punch blades 104 being biased against punch holder 30 such that each blade cutting edge 190 is beyond its corresponding cutting edge 128 of the die. The bottommost surfaces 192 and 194 of heels 170 and 172 serve the additional purpose of eliminating distortion of leads 152 after the excise and form operation by remaining in contact with die pressure pad 130.

FIG. 7 illustrates step by step the simultaneous excise and form operation provided by the present invention. FIG. 7 is enlarged to show the detail of step-by-step operation, the simultaneous excise and form operation of the present invention as one punch blade 104.

Figure 7G:
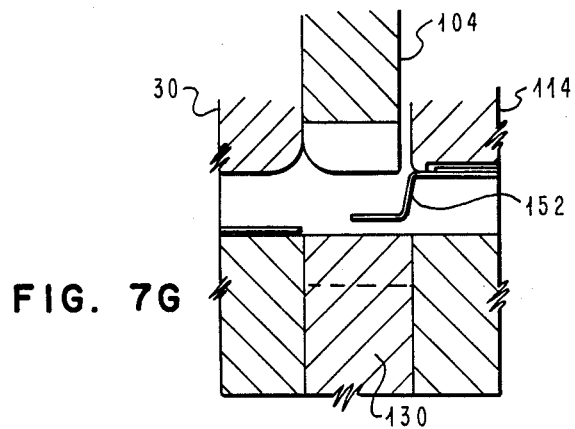
FIGS. 7A through 7G is a step by step illustration of the excise and form operation of the present invention.
Figure 7A:
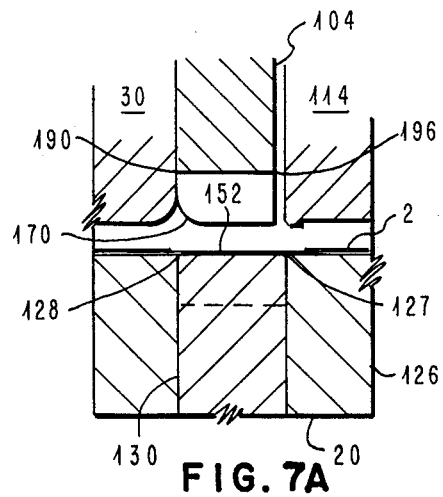

In FIG. 7A, punch blade 104 is biased against punch holder 30 so that there is some clearance between blade 104 and punch pressure pad 114. Tape 2 is disposed between punch holder 30 and die 20 such that the area of metallic leads 152 to be cut and formed have been aligned properly between punch and die. Blade 104 is positioned above spring loaded die pressure pad 130. The cutting edge 128 of the die is shown at the left. As noted earlier, punch blade 104 under the influence of spring 106 is not in vertical alignment with die cutting edge 128.

Figure 7B:
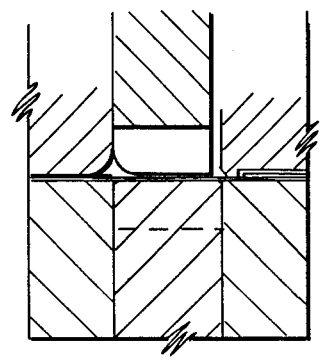

In FIG. 7B the die set is closed as a result of the activation of cylinder 70 which lowers top plate 60 (FIG. 1). Punch holder 30 rests on the face of die 20 but there is no contact with tape 2 because of pads 182 on punch guiderails 100.

Figure 7C:
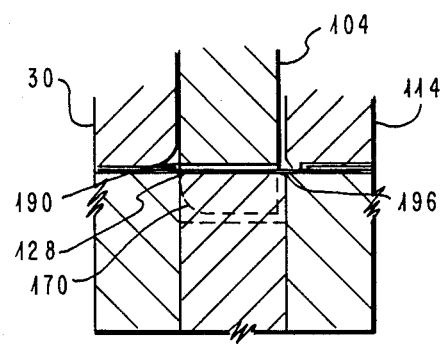

The self aligning feature of the present invention is illustrated in FIG. 7C where the camming action of heel 170 has caused punch blade 104 to move somewhat to the right, lessening the clearance between blade 104 and punch pressure pad 114 while overcoming the force of spring 106, which urges blade 104 leftwardly against punch holder 30.

At this point in the sequence, only the alignment heels of the blade have entered heel receiving corners 178 of die opening 125. The cutting edge 190 of blade 104 has not yet made contact with leads 152.

Figure 7D:
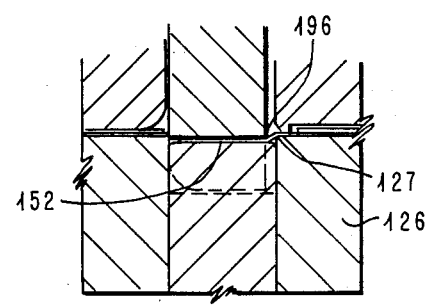

In FIG. 7D, punch blade 104 has advanced in its downward travel so that leads 152 are severed at the point where cutting edge 190 of punch blade 104 meets die cutting edge 128. Simultaneously this downward travel brings forming edge 196 into operation to push leads 152 over forming corner 127 of forming block 126.

Figure 7E:
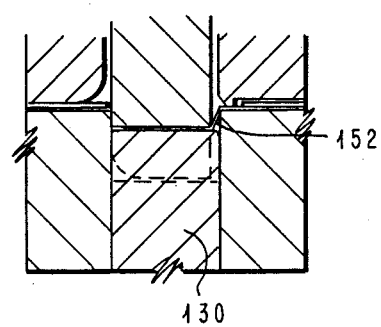

Forming of leads 152 continues as illustrated in FIG. 7E where leads 152 are bent downwardly even more.

Figure 7F:
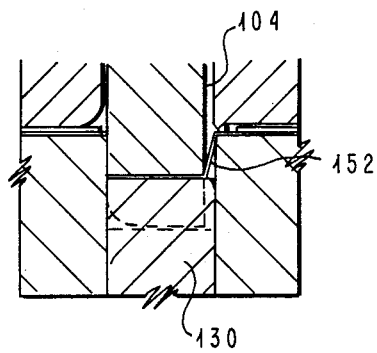

Note in FIGS. 7D-F that die pressure pad 130 has been sequentially lowered as well by the force of punch blade 104, though pressure pad 130 continues to oppose that force, thereby maintaining the delicate, now severed leads in their proper positions.

In FIG. 7F, forming is complete and at this point in the operating sequence the die set is ready to open with punch blades 104 still extended. Blades 104 remain extended to prevent deformation of leads 152 by die pressure pad 130, under influence of the upward bias of spring 134.

In FIG. 7G, punch holder 30 has been returned to its raised position by the deactivation of cylinder 70. Punch blade 104 has been retracted by the deactivation of cylinder 80, but only after the die set has been opened so as to avoid distortion to the excised leads by the upward force exerted by die pressure pad 130.

The force of spring 106 has pushed punch blade 104 once again against punch holder 30. The TAB device, with its excised and formed leads 152, is retained on punch pressure pad 114 by the force of vacuum drawn through channels 117 and 118 (FIG. 4), ready for transfer to a subsequent operation, in the illustrated preferred embodiment to presentation stage 44 (FIG. 1).

Figure 8:
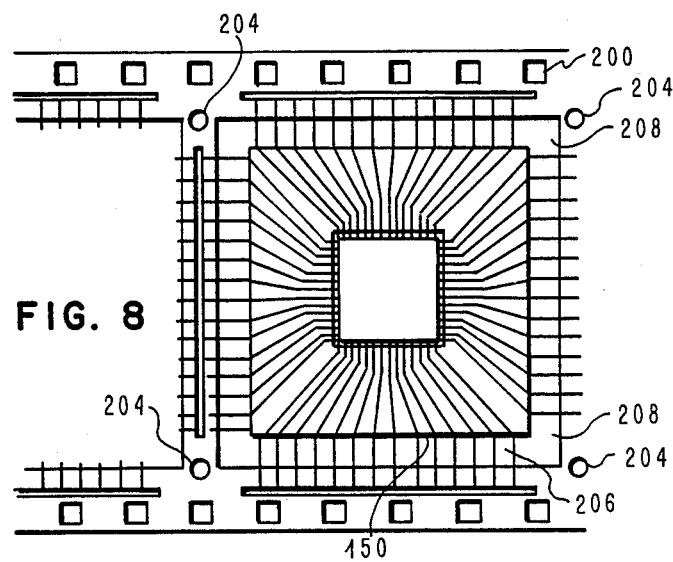
FIG. 8 is a schematic plan view of one frame of tape bearing a leaded electronic component.

FIG. 8 is an enlarged schematic illustration of a frame of tape 2 on which the apparatus of the present invention operates. Tape 2 is provided with sprocket feed holes 200, which in the preferred embodiment are engaged by sprocket wheel 35, FIG. 1. Pilot holes 204 are provided during manufacture at the appropriate locations to be engaged by pilot pins 160 to align a frame at the excise and form station of the apparatus shown in FIG. 1. Leads 152 are excised through outer lead windows 206 not covered by film 150. At the time of tape 2 manufacture corners 208 of outer lead windows 206 are formed, as well, for accommodating heels 170 and 172 of punch blades 104 during the excise and form operation.

Figure 9:
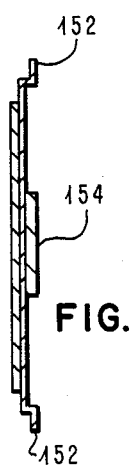
FIG. 9 shows a cross-sectional view of an excised and formed component.

FIG. 9 shows in cross-section, an excised TAB device with its leads formed by the action described in connection with FIG. 7.

The overall operation of the apparatus shown in FIG. 1 is as follows. Tape 2 is unwound from reel 4 and a frame containing a chip 154, as indicated by sensor 22, is positioned between punch holder 30 and die 20. Punch holder 30 is lowered through the action of cylinder 70. Preliminary alignment of the tape frame at the excise and form station is accomplished by the nesting of punch guides 100 with die guiderails 102. Cylinder 80 is then activated to drive down pilot pins 160 which pass through alignment holes 204 in the tape, FIG. 8, and enter alignment holes 164 in the die. In this manner fine alignment of the tape frame at the excise and form station is accomplished.

The excise and form operation takes place as described in connection with FIG. 7A–7F. Vacuum is drawn through channels 117 and 118 in punch holder 30. When the die set is opened, blades 104 are retracted when cylinder 80 is deactivated. Cylinder 42 is activated to move slide 40, and thus punch holder 30, to the position shown in phantom in FIG. 1 above presentation stage 44.

Cylinder 70 is again activated to lower punch holder 30 to presentation stage 44, which is provided with features similar to die 20 to allow for both gross and precision alignment. A vacuum is pulled on the underside of the excised and formed TAB part through holes located in the top surface of presentation stage 44.

Vacuum in punch holder 30 is then removed so that the punch holder itself may be moved without adversely affecting the excised and formed TAB part.

It is recognized that it is within the skill of the art to calculate blanking pressure to be applied by cylinders 70 and 80 and the vacuum forces in punch holder 30 and presentation stage 44 as a function of tool design and the properties of material to be blanked and held.

While the invention has been shown and described having reference to particular preferred embodiment, those having skill in the art will understand that various changes may be made in form and detail without departing from the spirit and scope of the invention as claimed.

I claim:

1. Apparatus for automatedly handling leaded electronic components born on a flexible tape comprising:
   means for simultaneously excising a component from the tape and forming its leads;
   means for feeding the tape to and past said means for simultaneously excising and forming;
   means for precisely aligning a component at said means for simultaneously excising and forming;
   a component pickup station; and
   means for conveying a component, excised and formed, to said station pickup for subsequent operations thereon.

2. The apparatus of claim 1 wherein said means for simultaneously excising and forming comprises:
   a zero clearance punch and die set including a plurality of punch blades adapted to be vertically lowered into complementary die openings;
   spring means biasing said punch blades laterally away from said die openings;
   a pair of camming heels disposed on the lower edges of each punch blade, said heels being vertically lower than cutting edges of said punch blades and adapted to cam said punch blades into said complementary die openings when the die set is closed.

3. The apparatus of the claims 1 or 2, additionally including:
   means for grossly aligning a component at said means for simultaneously excising and forming,
   said means for grossly aligning comprising two pairs of guide rails, one pair associated with said punch and one pair associated with said die, orthogonally oriented to each other and adapted to nest when said die set is closed.

4. The apparatus of claim 3, wherein said means for precisely aligning comprises:
   a plurality of alignment pins in said punch adapted to be lowered into complementary alignment holes in said die through apertures in said tape after said die set is closed.

5. The apparatus of claim 2, wherein said die includes openings adapted to matingly receive said pairs of camming heels without totally constraining motion of said tape.

6. The apparatus of claims 2 or 5, wherein each of said plurality of punch blades additionally includes a forming edge adapted for cooperation with a forming corner in said die.

7. The apparatus of claim 2, wherein said component pickup station includes:
   means for aligning with said means for conveying in order to maintain precision orientation of said excised and formed component.

8. The apparatus of claim 1, additionally including:
   sensing means adjacent said means for simultaneously excising and forming for detecting presence of a component on a frame of said tape; and
   control means associated with said sensing means for continuing feeding until presence of a component is detected.

9. The apparatus of claim 4, additionally including:
   means for closing said die set; and
   means operable after said means for closing for lowering said alignment pins and said plurality of punch blades.

10. The apparatus of claim 7, wherein said means for conveying includes:
   pad means, conformingly configured to said excised and formed component, in said punch for retaining said component in precision orientation; and
   means connected to said punch for moving said punch into position for transferring said excised and formed component to said pick up station.

* * * * *